(12) United States Patent
Wu et al.

(10) Patent No.: US 7,465,970 B2
(45) Date of Patent: Dec. 16, 2008

(54) COMMON PASS GATE LAYOUT OF A D FLIP FLOP

(75) Inventors: Jeng-Huang Wu, Taipei (TW); Chiung-Yu Feng, Hsin-Chu Hsien (TW); Chien-Chih Huang, Chiayi (TW); Yu-Wen Tsai, Hsin-Chu (TW)

(73) Assignee: Faraday Technology Corp., Science Based Industrial Park, Hsin-Chu (TW)

( * ) Notice: Subject to any disclaimer, the term of this patent is extended or adjusted under 35 U.S.C. 154(b) by 358 days.

(21) Appl. No.: 11/382,700

(22) Filed: May 10, 2006

(65) Prior Publication Data

US 2007/0262349 A1    Nov. 15, 2007

(51) Int. Cl.
*H01L 27/02* (2006.01)
*H01L 27/10* (2006.01)

(52) U.S. Cl. .................. 257/202; 257/204; 257/206; 257/369; 257/E27.107; 257/E27.108

(58) Field of Classification Search ................ 257/202, 257/204, 369, 206
See application file for complete search history.

(56) References Cited

U.S. PATENT DOCUMENTS

| | | | |
|---|---|---|---|
| 5,079,614 A * | 1/1992 | Khatakhotan | 257/369 |
| 6,838,713 B1 | 1/2005 | Gheewala et al. | |
| 2001/0052623 A1* | 12/2001 | Kameyama et al. | 257/369 |
| 2002/0074570 A1* | 6/2002 | Possley | 257/202 |
| 2006/0097294 A1* | 5/2006 | Yamashita et al. | 257/288 |

* cited by examiner

*Primary Examiner*—Dao H Nguyen
(74) *Attorney, Agent, or Firm*—Winston Hsu

(57) ABSTRACT

A semiconductor layout includes a p substrate, a first semiconductor cell formed over the p substrate, and a second semiconductor cell formed over the p substrate adjacent to the first semiconductor cell. A total height of the first semiconductor cell and the second semiconductor cell is twice a height of a standard semiconductor cell, and the height of the second semiconductor cell is adjusted according to the height of the first semiconductor cell.

9 Claims, 3 Drawing Sheets

COMMON PASS GATE LAYOUT OF A D FLIP FLOP

BACKGROUND OF THE INVENTION

1. Field of the Invention

The present invention provides a common pass gate layout of a D flip-flop, and more particularly, a common pass gate layout capable of increasing layout density.

2. Description of the Prior Art

In order to design a circuit more efficiently, logic cell libraries composed of commonly used logic circuits are used in the prior art. According to different requirements, a designer must select adaptive logic cell libraries to synthesize logic circuits. In the logic cell libraries, a layout of a master-slave D flip-flop is very important because it occupies a noticeable area in a random logic synthesis block.

Please refer to FIG. 1, which illustrates a schematic diagram of a prior art master-slave D flip-flop 10. The master-slave D flip-flop 10 includes terminals D, CK, Q, and QB for performing a logic operation, which is well known by those skilled in the art, and will not be narrated in detail. As shown in FIG. 1, the master-slave D flip-flop 10 includes four common pass gates 12, 14, 16, and 18, composed by eight MOS (metal oxide semiconductor) transistors, whose gate signals CK1 and CKB are provided by a cell's internal clock buffer 19. Both of the signals CK1 and CKB are transmitted to two p and two n MOS transistors. In a chip implemented by standard logic cell libraries, the master-slave D flip-flop may need a considerable layout area. However, the prior art does not include an efficient method for laying the master-slave D flip-flop, so that chip density is low, and system resources are wasted.

SUMMARY OF THE INVENTION

It is therefore a primary objective of the claimed invention to provide common pass gate layouts of D flip-flops.

An exemplary embodiment of a common pass gate layout a D flip-flop comprises a first n diffusion region, a second n diffusion region, a first poly-silicon conductor, a second poly-silicon conductor, a first p diffusion region, a second p diffusion region, a third poly-silicon conductor, a fourth poly-silicon conductor, a first clock output pin, and a second clock output pin. The first poly-silicon conductor extends from the first n diffusion region to the second n diffusion region, and is utilized for forming two gates by bisecting the first n diffusion region and the second n diffusion region respectively. The second poly-silicon conductor extends from the first n diffusion region to the second n diffusion region, and is utilized for forming two gates by bisecting the first n diffusion region and the second n diffusion region respectively. The first p diffusion region is adjacent to the second n diffusion region. The third poly-silicon conductor extends from the first p diffusion region to the second p diffusion region, and is utilized for forming two gates by bisecting the first p diffusion region and the second p diffusion region respectively. The fourth poly-silicon conductor extends from the first p diffusion region to the second p diffusion region, and is utilized for forming two gates by bisecting the first p diffusion region and the second p diffusion region respectively. The first clock output pin is coupled to the first poly-silicon conductor and the fourth poly-silicon conductor, and utilized for outputting a first clock signal. The second clock output pin is coupled to the second poly-silicon conductor and the third poly-silicon conductor, and utilized for outputting a second clock signal.

An exemplary embodiment of a common pass gate layout a D flip-flop comprises a first semiconductor cell, a second semiconductor cell, a fifth poly-silicon conductor, and a sixth poly-silicon conductor. The first semiconductor cell comprises a first n diffusion region, a second n diffusion region, a first poly-silicon conductor, a second poly-silicon conductor, a first p diffusion region, a second p diffusion region, a third poly-silicon conductor, and a fourth poly-silicon conductor. The first poly-silicon conductor extends from the first n diffusion region to the second n diffusion region, and is utilized for forming two gates by bisecting the first n diffusion region and the second n diffusion region respectively. The second poly-silicon conductor extends from the first n diffusion region to the second n diffusion region, and is utilized for forming two gates by bisecting the first n diffusion region and the second n diffusion region respectively. The first p diffusion region is adjacent to the second n diffusion region. The third poly-silicon conductor extends from the first p diffusion region to the second p diffusion region, and is utilized for forming two gates by bisecting the first p diffusion region and the second p diffusion region respectively. The fourth poly-silicon conductor extends from the first p diffusion region to the second p diffusion region, and is utilized for forming two gates by bisecting the first p diffusion region and the second p diffusion region respectively. The second semiconductor cell comprises a first clock output pin and a second clock output pin. The first clock output pin is utilized for outputting a first clock signal. The second clock output pin is utilized for outputting a second clock signal. The fifth poly-silicon conductor extends from the first clock output pin to the first poly-silicon conductor and the fourth poly-silicon conductor. The sixth poly-silicon conductor extends from the second clock output pin to the second poly-silicon conductor and the third poly-silicon conductor.

An exemplary embodiment of a semiconductor layout comprises a p substrate, a first semiconductor cell, and a second semiconductor cell. The first semiconductor cell is formed over the p substrate. The second semiconductor cell is formed over the p substrate adjacent to the first semiconductor cell. A total height of the first semiconductor cell and the second semiconductor cell is twice a height of a standard semiconductor cell, and the height of the second semiconductor cell is adjusted according to the height of the first semiconductor cell.

These and other objectives of the present invention will no doubt become obvious to those of ordinary skill in the art after reading the following detailed description of the preferred embodiment that is illustrated in the various figures and drawings.

DETAILED DESCRIPTION

The present invention increases layout density of a D flip-flop with a common pass gate layout.

Figure 1:
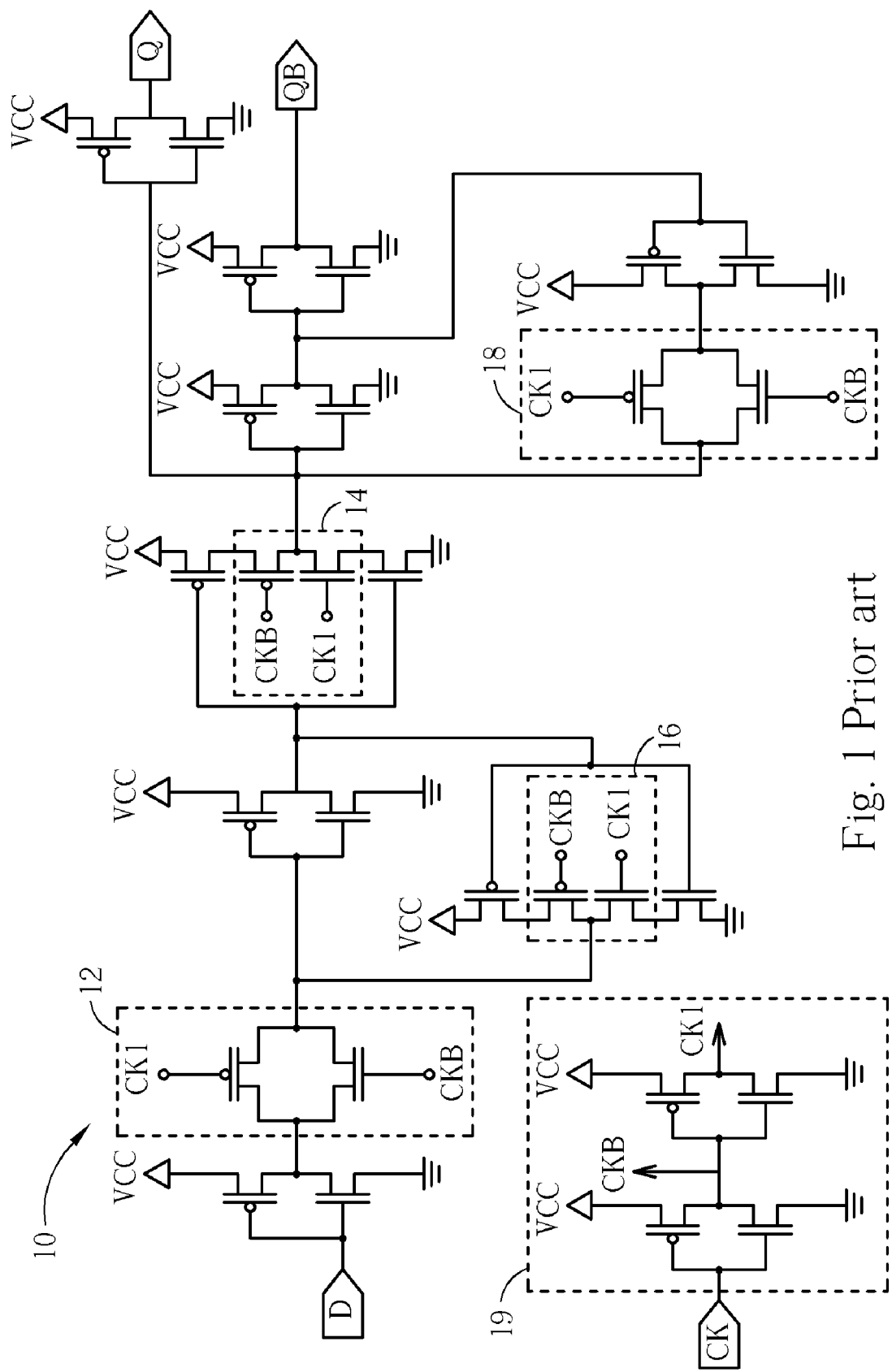
FIG. 1 illustrates a schematic diagram of a prior art master-slave D flip-flop.
Figure 2:
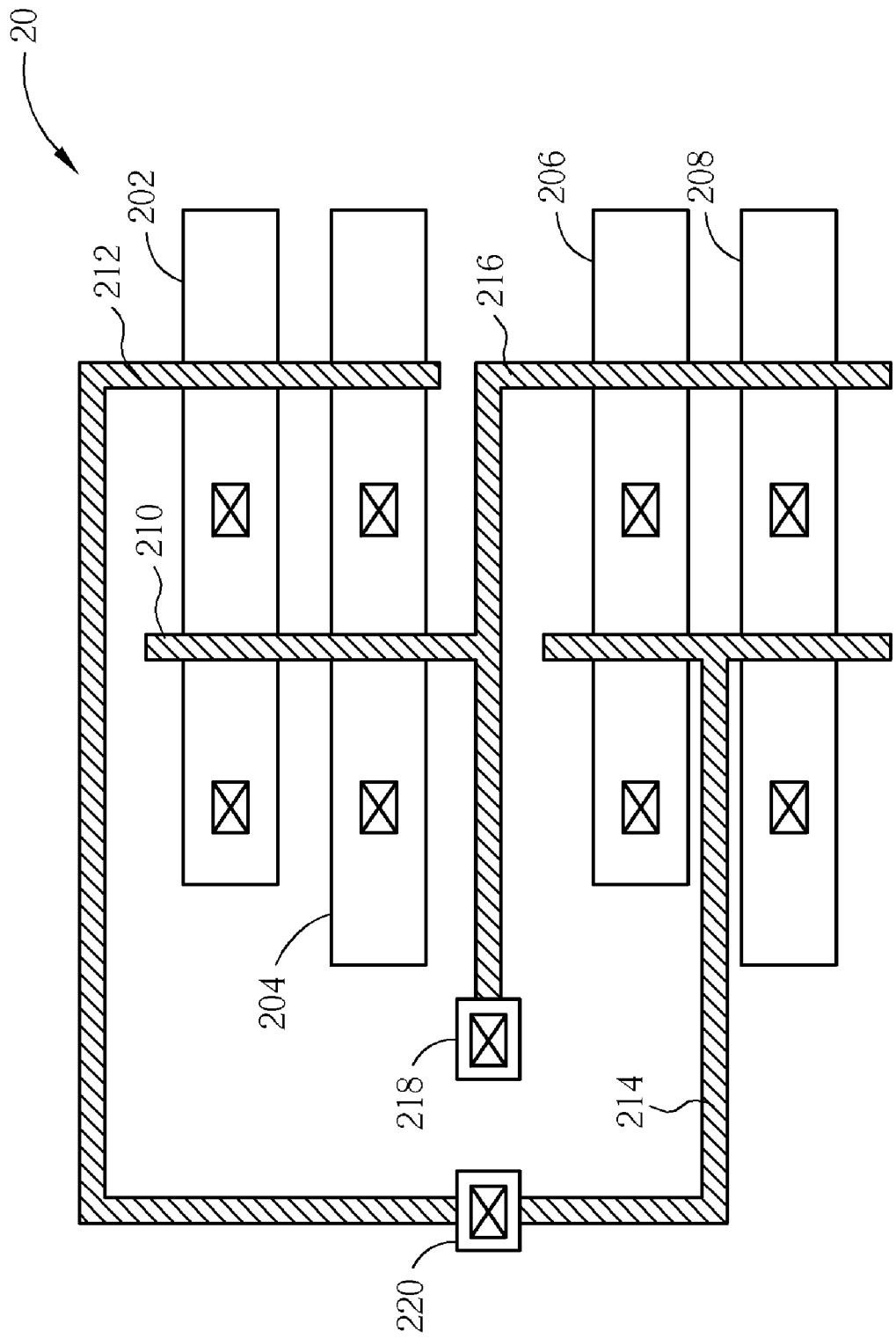
FIG. 2 illustrates a schematic diagram of a common pass gate layout of a D flip-flop in accordance with a first embodiment of the present invention.

Please refer to FIG. 2, which illustrates a schematic diagram of a common pass gate layout 20 of a D flip-flop in accordance with a first embodiment of the present invention. The common pass gate layout 20 includes a first n diffusion region 202, a second n diffusion region 204, a first p diffusion region 206, a second p diffusion region 208, a first poly-silicon conductor 210, a second poly-silicon conductor 212, a third poly-silicon conductor 214, a fourth poly-silicon conductor 216, a first clock output pin 218, and a second clock output pin 220. Both of the first poly-silicon conductor 210 and the second poly-silicon conductor 212 extend from the first n diffusion region 202 to the second n diffusion region 204, and bisect the first n diffusion region 202 and the second n diffusion region 204 to form four n MOS transistors. Similarly, both of the third poly-silicon conductor 214 and the fourth poly-silicon conductor 216 extend from the first p diffusion region 206 to the second p diffusion region 208, and bisect the first p diffusion region 206 and the second p diffusion region 208 to form four p MOS transistors. The first clock output pin 218 outputs a clock signal to the first poly-silicon conductor 210 and the fourth poly-silicon conductor 216, and the second clock output pin 220 outputs another clock signal to the second poly-silicon conductor 212 and the third poly-silicon conductor 214.

In the common pass gate layout 20, each poly-silicon conductor forms two MOS transistors. Therefore, the common pass gate layout 20 includes four n and four p MOS transistors. Both of the first clock output pin 218 and the second clock output pin 220 transmit the clocks signals (CK1 and CKB) to two p and two n MOS transistors to implement the common pass gate of the D flip-flop. By forming two MOS transistors with a poly-silicon conductor, the present invention can efficiently lay the common pass gate on a semiconductor cell. However, when compressing the semiconductor cell, there must be spaces between units of the semiconductor cell for preventing inter-effect between the units. In this case, the common pass gate layout 20 cannot be compressed efficiently. Therefore, the present invention further provides another embodiment to solve the above problem.

Figure 3:
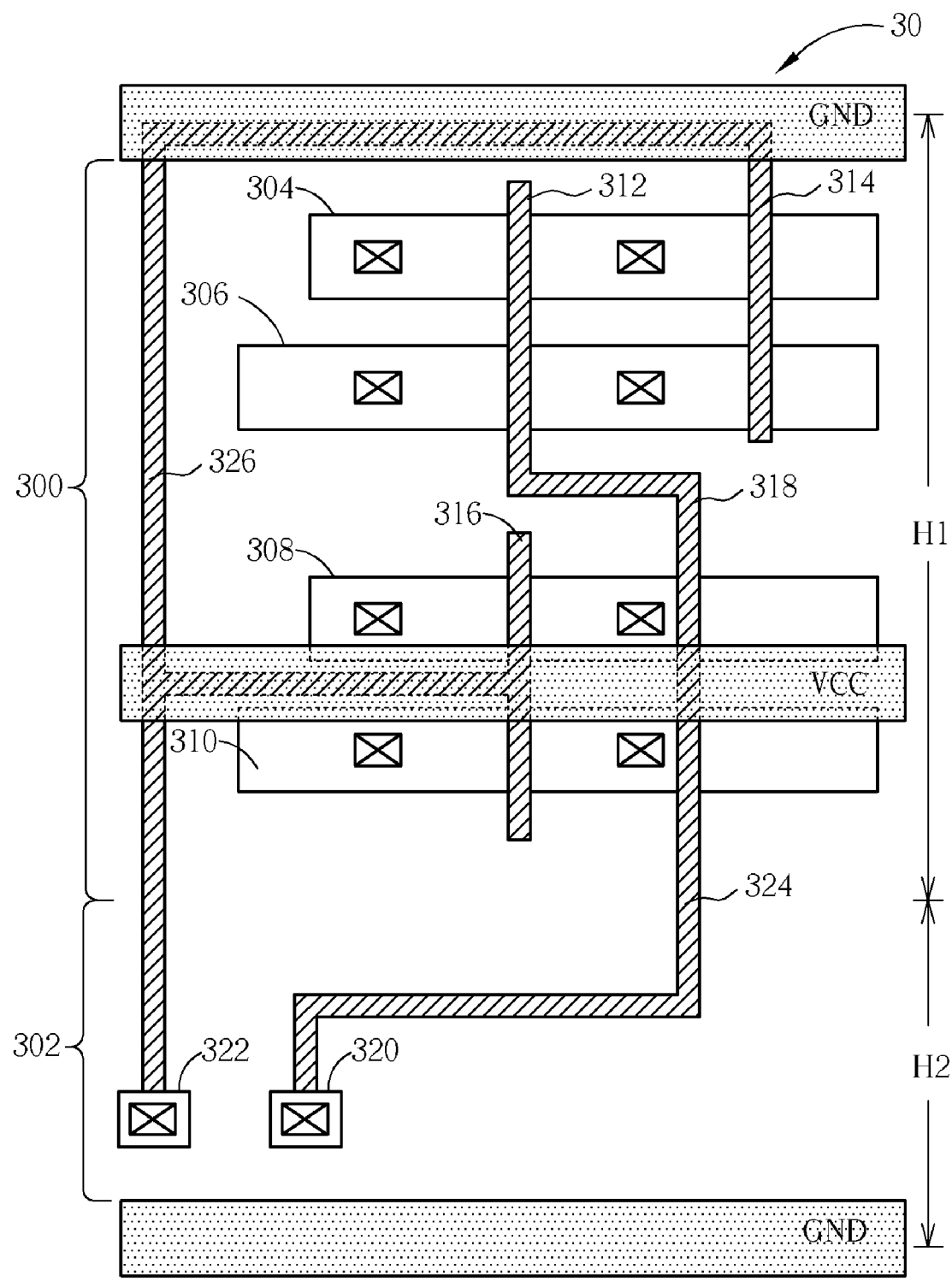
FIG. 3 illustrates a schematic diagram of a common pass gate layout of a D flip-flop in accordance with a second embodiment of the present invention.

Please refer to FIG. 3, which illustrates a schematic diagram of a common pass gate layout 30 of a D flip-flop in accordance with a second embodiment of the present invention. The common pass gate layout 30 includes a first semiconductor cell 300 and a second semiconductor cell 302. The first semiconductor cell 300 includes a first n diffusion region 304, a second n diffusion region 306, a first p diffusion region 308, a second p diffusion region 310, a first poly-silicon conductor 312, a second poly-silicon conductor 314, a third poly-silicon conductor 316, and a fourth poly-silicon conductor 318. Both of the first poly-silicon conductor 312 and the second poly-silicon conductor 314 extend from the first n diffusion region 304 to the second n diffusion region 306, and bisect the first n diffusion region 304 and the second n diffusion region 306 to form four n MOS transistors. Similarly, both of the third poly-silicon conductor 316 and the fourth poly-silicon conductor 318 extend from the first p diffusion region 308 to the second p diffusion region 310, and bisect the first p diffusion region 308 and the second p diffusion region 310 to form four p MOS transistors. The second semiconductor cell 302 includes a first clock output pin 320 and a second clock output pin 322 for outputting clock signals (CK1 and CKB). The common pass gate layout 30 further includes a fifth poly-silicon conductor 324 and a sixth poly-silicon conductor 326. The fifth poly-silicon conductor 324 extends from the first clock output pin 320 to the first poly-silicon conductor 312 and the fourth poly-silicon conductor 318, and the sixth poly-silicon conductor 326 extends from the second clock output pin 322 to the second poly-silicon conductor 314 and the third poly-silicon conductor 316.

As shown in FIG. 3, the common pass gate layout 30 is a layout with double cell height, and includes four common pass gates in the first semiconductor cell 300 and output terminals of the clock signals in the second semiconductor cell 302. Therefore, when compressing the common pass gate layout 30, a height H2 of the second semiconductor cell 302 is adjusted based on a height H1 of the first semiconductor cell 300. That is, if the first semiconductor cell 300 cannot be compressed to half the height of the common pass gate layout 30, a designer can reduce the height H2 of the second semiconductor cell 302, so as to lay the first semiconductor cell 300 and the second semiconductor cell 302 within the required height, and construct a high-density cell library.

In summary, the common pass gate layout of the present invention can increase layout density, decrease layout area, and save system resources.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A common pass gate layout of a D flip-flop comprising:
   a first n diffusion region;
   a second n diffusion region;
   a first poly-silicon conductor extending from the first n diffusion region to the second n diffusion region, for forming two gates by bisecting the first n diffusion region and the second n diffusion region respectively;
   a second poly-silicon conductor extending from the first n diffusion region to the second n diffusion region, for forming two gates by bisecting the first n diffusion region and the second n diffusion region respectively;
   a first p diffusion region adjacent to the second n diffusion region;
   a second p diffusion region;
   a third poly-silicon conductor extending from the first p diffusion region to the second p diffusion region, for forming two gates by bisecting the first p diffusion region and the second p diffusion region respectively;
   a fourth poly-silicon conductor extending from the first p diffusion region to the second p diffusion region, for forming two gates by bisecting the first p diffusion region and the second p diffusion region respectively;
   a first clock output pin coupled to the first poly-silicon conductor and the fourth poly-silicon conductor, for outputting a first clock signal; and
   a second clock output pin coupled to the second poly-silicon conductor and the third poly-silicon conductor, for outputting a second clock signal.

2. The common pass gate layout of claim 1, wherein the first clock signal is an inverse of the second clock signal.

3. The common pass gate layout of claim 1 being formed in a standard semiconductor cell.

4. The common pass gate layout of claim 3, wherein a height of the standard semiconductor cell is 6, 7, 8, or 9 grids.

5. A common pass gate layout of a D flip-flop comprising:
   a first semiconductor cell comprising:
      a first n diffusion region;
      a second n diffusion region;
      a first poly-silicon conductor extending from the first n diffusion region to the second n diffusion region, for forming two gates by bisecting the first n diffusion region and the second n diffusion region respectively;
      a second poly-silicon conductor extending from the first n diffusion region to the second n diffusion region, for forming two gates by bisecting the first n diffusion region and the second n diffusion region respectively;

a first p diffusion region adjacent to the second n diffusion region;

a second p diffusion region;

a third poly-silicon conductor extending from the first p diffusion region to the second p diffusion region, for forming two gates by bisecting the first p diffusion region and the second p diffusion region respectively; and a fourth poly-silicon conductor extending from the first p diffusion region to the second p diffusion region, for forming two gates by bisecting the first p diffusion region and the second p diffusion region respectively;

a second semiconductor cell comprising:

a first clock output pin for outputting a first clock signal; and a second clock output pin for outputting a second clock signal;

a fifth poly-silicon conductor extending from the first clock output pin to the first poly-silicon conductor and the fourth poly-silicon conductor; and a sixth poly-silicon conductor extending from the second clock output pin to the second poly-silicon conductor and the third poly-silicon conductor.

6. The common pass gate layout of claim 5, the first clock signal is an inverse of the second clock signal.

7. The common pass gate layout of claim 5, wherein a total height of the first semiconductor cell and the second semiconductor cell is twice a height of a standard semiconductor cell.

8. The common pass gate layout of claim 7, wherein the height of the standard semiconductor cell is 6, 7, 8, or 9 grids.

9. The common pass gate layout of claim 7, wherein the height of the second semiconductor cell is adjusted according to the height of the first semiconductor cell.

* * * * *